(12) United States Patent
Kang et al.

(10) Patent No.: US 8,003,481 B1
(45) Date of Patent: Aug. 23, 2011

(54) METHOD FOR FABRICATING A CAPACITOR

(75) Inventors: Seung-Dong Kang, Seoul (KR);
Chang-seog Ko, Seoul (KR); Seung-jin Lee, Busan-kwangyeokshi (KR);
Kyoung-Bok Lee, Kyunggi-do (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 0 days.

(21) Appl. No.: 09/275,808

(22) Filed: Mar. 25, 1999

(30) Foreign Application Priority Data

Apr. 9, 1998 (KR) ..................................... 98-12562

(51) Int. Cl.
*H01L 21/20* (2006.01)
(52) U.S. Cl. .................. 438/398; 438/396; 438/255
(58) Field of Classification Search .................. 438/396, 438/398, 399, 253, 265
See application file for complete search history.

(56) References Cited

U.S. PATENT DOCUMENTS 5,385,863 A * 1/1995 Tatsumi et al. ............... 437/109
5,821,152 A * 10/1998 Han et al. ...................... 438/398

* cited by examiner

*Primary Examiner* — Donald L. Monin, Jr.
*Assistant Examiner* — Ginette Peralta
(74) *Attorney, Agent, or Firm* — Jones Volentine, LLC

(57) ABSTRACT

A method for forming an HSG (hemispherical grain) layer on a storage electrode of a capacitor formed on a substrate is provided. The method includes a step of introducing a source gas into a reacting chamber to deposit a small amount of HSG nuclei on a conductive layer pattern of a capacitor electrode during a step of stabilizing the substrate temperature. After the substrate temperature is stabilized, a larger amount of source gas is introduced into the chamber to form additional HSG nuclei. Thereafter, a step of annealing is performed to form the HSG layer.

17 Claims, 4 Drawing Sheets

16b

26b

METHOD FOR FABRICATING A CAPACITOR

FIELD OF THE INVENTION

The present invention relates to a method for fabricating a capacitor, and more particularly to a method for fabricating a storage electrode of a capacitor.

BACKGROUND OF THE INVENTION

Recently, various methods of increasing a surface area of a doped silicon or polycrystalline (poly) electrode plate capacitor to increase capacitance have been suggested. A method of forming hemispherical grain (HSG) poly on a lower conductive layer pattern of a capacitor is extensively utilized. Since a surface formed with HSG has a three dimensional alternating concave-convex structure, the effective surface area is increased and consequently capacitance is increased when the surface formed with HSG is utilized as a capacitor electrode.

There are two methods of forming HSG on a capacitor electrode. One method is a blanket HSG forming method whereby HSG is deposited over an entire surface which includes oxide insulator portions and lower conductive layer patterns of the capacitor electrode and then etching back the HSG down to the oxide insulator. The other method is a selective HSG forming method of forming the HSG only on the conductive layer patterns of the capacitor.

In the blanket HSG forming method, a problem encountered is that the practical capacitance is reduced when part of the HSG on the conductive layer patterns of the capacitor electrode portions are also etched during the HSG etch back step. As such, the blanket HSG forming method is not used as often as the selective HSG forming method.

FIGS. 1A-1C are flow diagrams which show process steps of a prior art technique for forming HSG selectively on the surface of the conductive layer pattern of the capacitor in a reacting chamber.

The method comprises the steps of filling in a contact hole formed in an oxide layer 12 formed on a semiconductor substrate 10 with silicon to form the conductive layer pattern of the capacitor 14 (FIG. 1A), introducing a reacting or source gas into the reacting chamber to form HSG nuclei 16 on the surface of the conductive layer pattern 14 (FIG. 1B), and growing the HSG nuclei 16 to form an HSG layer 16a (FIG. 1C).

The selective HSG forming process is generally performed in a cold or warm wall type reacting chamber since a selectivity loss margin (the undesirable lateral encroachment of HSG formation into an area outside of the patterned area) is the lowest.

In a cold wall type reacting chamber, an internal wall of the chamber is maintained at a temperature of about 10° C. to 20° C. by flowing cooling water along an internal wall to prevent any reacting gas from depositing any particulate on the inner surface of the internal wall. A warm wall type reacting chamber is comprised of a quartz wall surrounding a silicon carbide susceptor, and may be at a temperature between 200° C. to 500° C. The source gas introduced into the reacting chamber is typically pre-heated.

FIG. 2 is a graph which illustrates the relationship between an internal temperature and time in a reacting chamber in the prior art method of forming an HSG layer on the conductive layer pattern of the lower capacitor electrode in a cold wall type reacting chamber. Referring to FIG. 2, the method is divided into two steps, each step being performed at a distinct period of time. A first step stabilizes the temperature during a processing time (or interval) T1 and a second step forms the HSG. During a first time interval T1, the source gas is introduced into the reacting chamber to grow HSG on conductive layer patterns on the substrate. Once the internal temperature of the chamber has settled, the HSG layer is formed during a time interval T2.

Although the cold wall type reacting chamber approach will form a relatively large HSG nuclei, the amount of time which is required to fabricate the HSG layer results in a relatively longer processing time compared to the warm wall type reacting chamber. A longer processing period results in lower productivity and an increase in semiconductor production costs.

FIG. 3 is a graph illustrating a relationship between temperature and time in a warm wall type reacting chamber in the prior art method of fabricating the HSG layer on a surface of the lower capacitor electrode.

Referring to FIG. 3, the method for fabricating HSG by utilizing the warm wall type reacting chamber is divided into two steps: a first step T1' involves stabilizing the temperature of the ambient and a second step T2' involves forming and growing HSG nuclei. In the step of stabilizing temperature T1', as illustrated in FIG. 3, the source gas is not initially introduced into the reacting chamber. After a temperature of the reacting chamber ambient is equal to that of the substrate and subsequently stabilized, the source gas is introduced into the reacting chamber T2' to form the HSG nuclei and grow the HSG nuclei into an HSG layer by annealing.

Because the wall of the warm wall type reacting chamber may be at a temperature in the range of 200° C. to 500° C., the reaction time is shorter since the source gas is heated in the reacting chamber. However, the average grain size of the HSG layer tends to be smaller than that of the HSG layer formed in the cold wall type reacting chamber. The difference in grain size has a tremendous impact on the capacitance of the resulting capacitor. The smaller grain size formed using a warm wall type reacting chamber approach may cause the capacitance to be 10% to 20% lower than in the capacitor electrode formed in the cold wall type reacting chamber.

As a result, there exists a need for a method of fabricating a capacitor electrode with a relatively large surface area in order to increase capacitance in a relatively fast processing time to minimize production costs. Accordingly, an object of the present invention is to provide a method for fabricating a capacitor having relatively higher capacitance by enlarging an average grain size of an HSG layer formed on the lower capacitor electrode of the capacitor while not increasing the processing time and thus maintaining a low cost.

SUMMARY OF THE INVENTION

In one principal aspect, the present invention is a method of forming a capacitor in a reacting chamber by forming a first HSG nuclei using a first amount of source gas while an ambient temperature stabilizes at a first temperature range (e.g., 200° C. to 500° C.), forming a second HSG nuclei using a second amount of source gas once the ambient has stabilized, and annealing to form an HSG layer.

In a preferred embodiment of this aspect of the invention, the first amount (e.g., 5 sccm) of the source gas is less than the second amount of the source gas. Here, the source gas may include silicon and the internal pressure of the reacting chamber is less than $1 \times 10^{-3}$ torr. Moreover, the ambient temperature may be stabilized by heat radiating from the substrate which is heated to a temperature between 500° C. and 630° C.

In this aspect of the invention, a grain of HSG nuclei of the first HSG nuclei tends to be smaller than a grain of HSG nuclei from the second HSG nuclei (e.g., monocrystalline HSG).

In another principal aspect, the present invention is a method for depositing a hemispherical grain layer over a conductive layer pattern of a capacitor electrode on a substrate in an ambient for forming a semiconductor capacitor. A first amount of a source gas is introduced into the ambient to form a first plurality of hemispherical sections while the substrate stabilizes at a first temperature range. A second amount of the source gas is introduced into the ambient to form a second plurality of hemispherical sections over the first plurality of hemispherical sections to form a resulting structure. The resulting structure is then annealed to form the HSG layer. Here, radii of a section from the first plurality of hemispherical sections tends to be smaller than radii of a section from the second plurality of hemispherical sections. However, as is indicated above, a combination of the radii of the section from the first plurality of hemispherical sections and the radii of the section from the second plurality of hemispherical sections, results in an HSG layer which tends to be larger than the HSG layer formed according to either the cold wall type prior art technique or the warm wall type prior art technique.

In yet another principal aspect, the present invention is a method for forming a capacitor electrode of a capacitor in a reacting chamber. In this aspect of the invention, a first HSG nuclei are formed by introducing a first source gas into the reacting chamber while an ambient temperature stabilizes at a first temperature range and a second HSG nuclei are formed over the first HSG nuclei by introducing a second source gas into the reacting chamber after the ambient temperature has stabilized to form a resulting structure. The resulting structure is then annealed to form the HSG layer of the capacitor electrode. The HSG layer according to this aspect of the present invention tends to have a larger surface area than the HSG layer formed in a single HSG nuclei formation of the prior art techniques because it is the combination of the first and second HSG nuclei which produce a larger HSG layer.

BRIEF DESCRIPTION OF THE DRAWINGS

In the course of the detailed description to follow, reference will be made to the attached drawings, in which.

DETAILED DESCRIPTION OF THE INVENTION

The present invention is a method of fabricating a capacitor electrode having relatively higher capacitance by enlarging an average grain size of an HSG layer formed on a conductive layer pattern of a capacitor electrode. The HSG layer forming process of the present invention overcomes the uneconomically long processing time of some of the conventional techniques of forming a large grain HSG layer while preserving the large grain size of the HSG layer. The technique according to the present invention takes advantage of a reaction chamber stabilization period to seed a first HSG nuclei and accelerate the processing time. Once the reaction chamber has stabilized, a second HSG seeding is introduced to form a second HSG nuclei and the resulting structure is annealed to form an HSG layer. The combination of the first HSG nuclei and second HSG nuclei provide a resulting HSG layer of increased HSG grain size which may be considerably greater than those formed using techniques of the prior art.

Figure 4A:
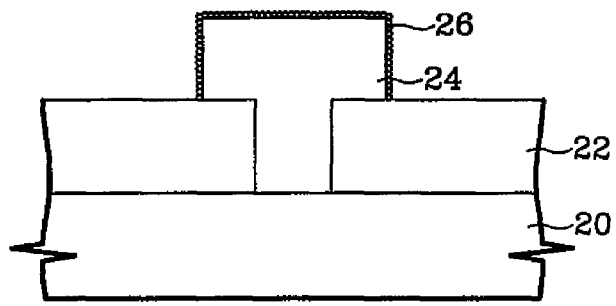
FIGS. 4A, 4B and 4C are flow diagrams showing the steps of selectively fabricating an HSG layer on a conductive layer pattern of a capacitor in accordance with method of the present invention.
Figure 4B:
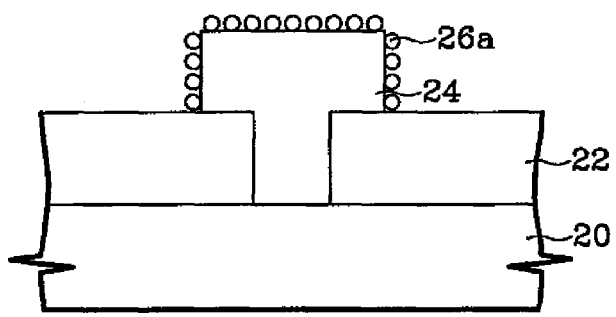
Figure 4C:
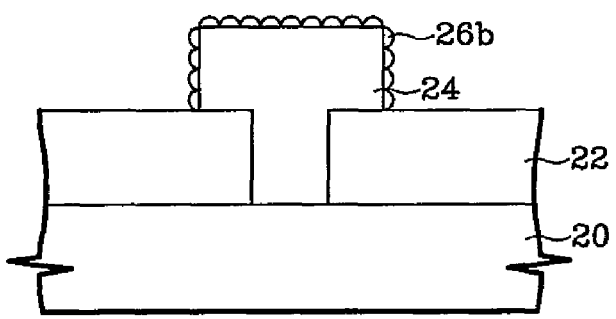

With reference to FIG. 4A, a conductive layer pattern 24 formed on a semiconductor substrate 20 with an insulating layer 22 is loaded into a warm wall type reacting chamber (not shown) while an ambient temperature of the reacting chamber stabilizes within a first temperature range (e.g., 200° C. to 500° C.). Those skilled in the art know that the reacting chamber is typically comprised of a quartz tube surrounding a susceptor, a silicon heater, a source gas inlet and an outlet. A first amount of source gas is introduced into the reacting chamber to form a first HSG nuclei 26. Then, a second amount of source gas is introduced into the reacting chamber to form a second HSG nuclei 26a as is illustrated in FIG. 4B. After the second HSG nuclei 26a are formed over the first HSG nuclei 26, the substrate 20 is annealed to form an HSG layer 26b as is shown in FIG. 4C.

In a preferred embodiment, the first amount of the source gas is less than 5 sccm and is pre-heated to a temperature of about 35° C. prior to introduction into the chamber. The second amount of source gas is larger than the first amount. In a preferred embodiment, the second amount of source gas is in the range of 5 sccm to 20 sccm. The source gas contains silicon, for example $SiH_4$, $Si_2H_6$, or DCS (dichlorosilane; $SiH_2Cl_2$). The internal pressure of the reacting chamber is less than $1 \times 10^{-3}$ torr during the formation of the first and second HSG nuclei. The ambient temperature may be stabilized by heating the substrate, for example, by using a silicon carbide heater to heat the susceptor that is supporting the substrate to a temperature between 500° C. and 630° C.

Figure 1A:
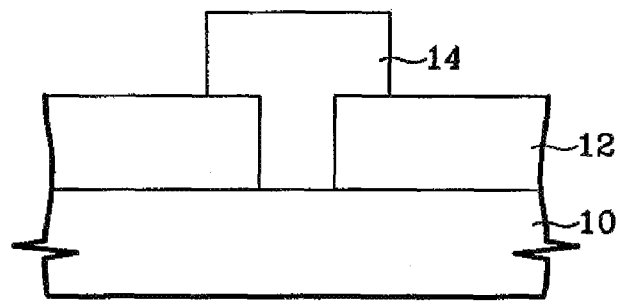
FIGS. 1A, 1B and 1C are flow diagrams showing the steps of selectively fabricating an HSG layer on a conductive layer pattern of a capacitor in accordance with a prior art method.
Figure 1B:
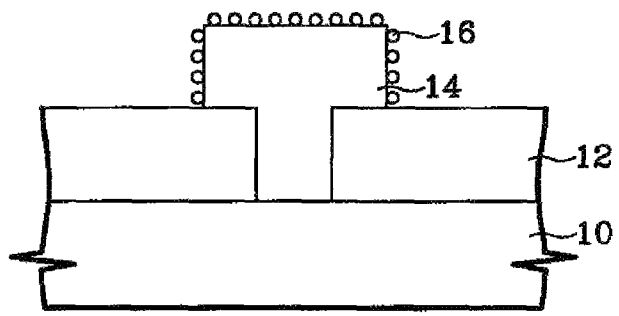
Figure 1C:
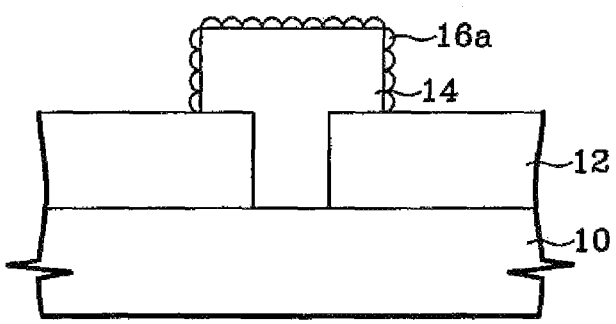

The method for fabricating an HSG layer according to the present invention differs considerably from the method of fabricating an HSG layer according to the prior art technique. With reference to FIGS. 1A through 1C, as described above, a prior art technique for forming the HSG layer includes a first step of stabilizing a temperature range of a substrate 10 with an ambient, before introducing a source gas into the ambient to form a plurality of hemispherical sections.

The method according to the present invention for forming the HSG layer includes introducing a first amount of a source gas into the ambient to form a first plurality of hemispherical sections while the temperature range of the substrate stabilizes, introducing a second amount of the source gas into the ambient to form a second plurality of hemispherical sections over the first plurality of hemispherical sections after the temperature range of the substrate has stabilized to form a resulting structure, and annealing the resulting structure to form an HSG layer. Thus, as is readily seen, the present invention minimizes the processing time and increases the effective capacitance by forming a first plurality of hemispherical sections during the stabilization period and then forming a second plurality of hemispherical sections thereafter. Also, the processing time for forming the second plurality of hemispherical section is not as long as the HSG forming step in the prior art technique in order to achieve a desired capacitance thereof since a first HSG seeding step has already formed an initial layer HSG nuclei during the stabilization period.

Figure 2:
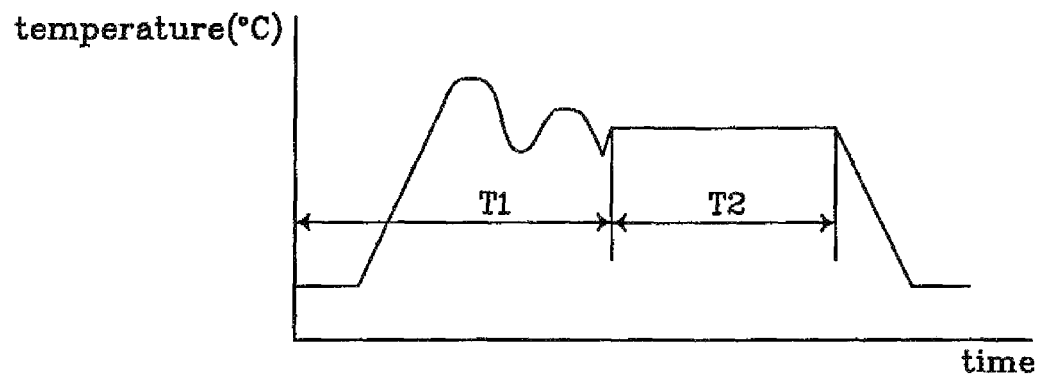
FIG. 2 is a graph showing the relationship between temperature and time in a cold wall type reacting chamber for selectively fabricating an HSG layer on a conductive layer pattern of a capacitor in accordance with the prior art technique.
Figure 3:
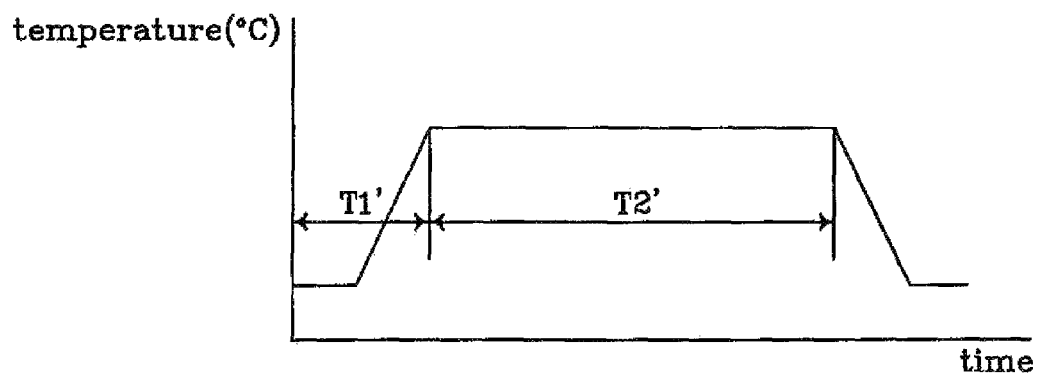
FIG. 3 is a graph showing the relationship between temperature and time in a warm wall type reacting chamber for selectively fabricating an HSG layer on a conductive layer pattern of a capacitor in accordance with the prior art technique.
Figure 5:
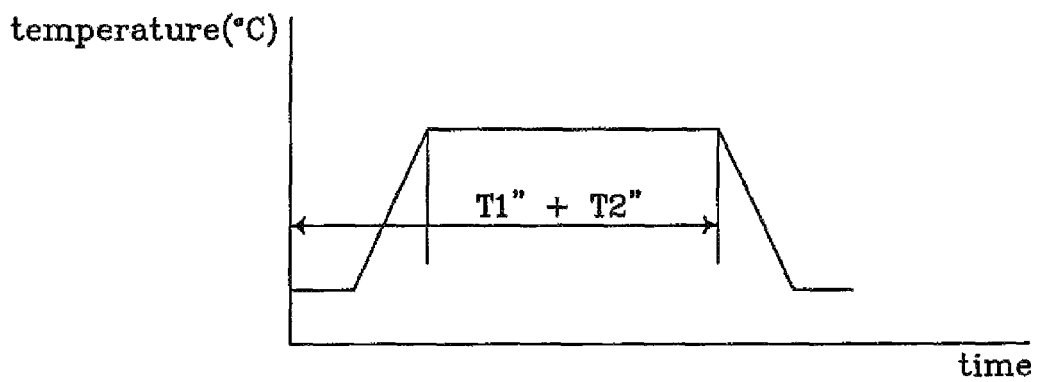
FIG. 5 is a graph showing the relationship between temperature and time in a reacting chamber for selectively fabricating an HSG layer on a conductive layer pattern of a capacitor in accordance with the method of the present invention.

In this regard, with reference to FIG. 5, the process time from stabilizing the temperature range of the substrate and forming the first plurality of hemispherical sections is defined as T1". The process time from forming the second plurality of hemispherical sections to the formation of the HSG layer is defined as T2". As is readily seen, the total processing time designated by T1"+T2" of the present invention is less than the summation of processing times T1' and T2' in FIG. 3 of the method according to the prior art for a warm wall reacting chamber, and the summation of processing times T1 and T2 in FIG. 2 of the method according to the prior art for a cold wall reacting chamber. Processing time according to the present invention is decreased since the initial layer HSG nuclei are formed during the stabilization period. As a result, compared to the prior art, an HSG capacitor electrode formed in accordance with the present invention will have a shorter processing time for achieving the desired capacitance and a larger HSG grain size for the same processing time.

Figure 6A:
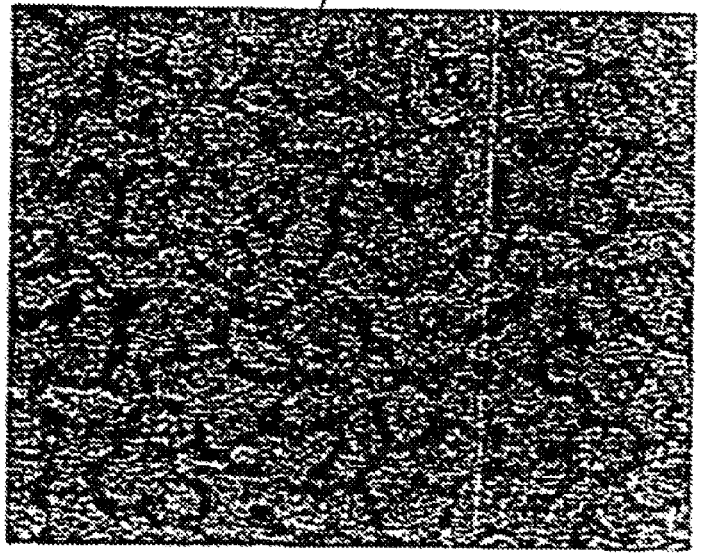
FIG. 6A is a photomicrograph of an HSG layer formed in accordance with the prior art technique.
Figure 6B:
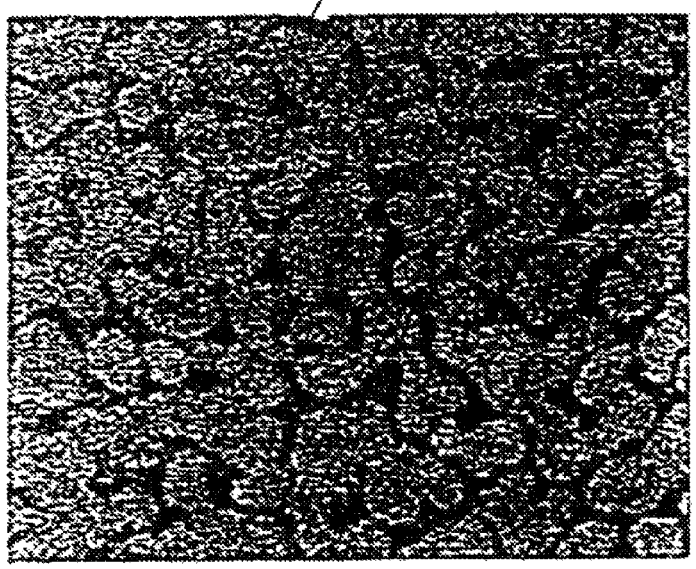
FIG. 6B is a photomicrograph of an HSG layer formed in accordance with the method of the present invention.

In this regard and with reference to FIG. 6B, the HSG grain 26b formed according to the method of the present invention is larger than the HSG grain 16b formed according to the prior art method as illustrated in FIG. 6A. As a result, the HSG capacitor electrode plate formed according to the present invention will have higher capacitance.

While this invention has been particularly shown and described with reference to the preferred embodiments thereof, it will be understood by those skilled in the art that various changes in form and details may be made without departing from the spirit and scope of this invention.

What is claimed is:

1. A method for forming a capacitor electrode of a capacitor in a reacting chamber, the method comprising:
    forming a first hemispherical grain (HSG) nuclei by introducing a first amount of a source gas into the reacting chamber while the temperature of the reacting chamber ambient is stabilizing within a first temperature range;
    forming a second hemispherical grain (HSG) nuclei over the first HSG nuclei by introducing a second amount of the source gas into the reacting chamber after the temperature of the reacting chamber ambient stabilizes within the first temperature range to form a resulting structure; and
    annealing the resulting structure.

2. The method according to claim 1, wherein the second amount of the source gas is larger than the first amount of the source gas.

3. The method according to claim 2, wherein the first amount of the source gas is less than 5 sccm.

4. The method according to claim 1, wherein an internal pressure of the reacting chamber is less than $1 \times 10^{-3}$ torr during the formation of at least one of the first HSG nuclei and the second HSG nuclei.

5. The method according to claim 1, wherein the resulting structure is formed on a conductive layer pattern on a substrate and the temperature of the reacting chamber ambient is stabilized at the first temperature range by heating the substrate at a temperature between 500° C. and 630° C.

6. The method according to claim 1, wherein said first temperature range is between 200° C. and 500° C.

7. A method for depositing a hemispherical grain layer over a conductive layer pattern of a capacitor electrode on a substrate in a reacting chamber ambient for forming a semiconductor capacitor, the method comprising:
    introducing a first amount of a source gas into the reacting chamber ambient, while heating the reacting chamber ambient, to form a first plurality of hemispherical sections while a temperature of the substrate is stabilizing within a first temperature range;
    introducing a second amount of the source gas into the reacting chamber ambient to form a second plurality of hemispherical sections over the first plurality of hemispherical sections after the temperature of the substrate stabilizes within the first temperature range to form a resulting structure; and
    annealing the resulting structure.

8. The method according to claim 7, wherein the first temperature range is between 500° C. and 630° C.

9. The method according to claim 7, wherein radii of a hemispherical section from the first plurality of hemispherical sections are smaller than radii of a hemispherical section from the second plurality of hemispherical sections.

10. The method according to claim 7, wherein the first amount of source gas is less than the second amount of source gas.

11. The method according to claim 7, wherein an internal pressure of the reacting chamber ambient is less than 1×10-3 torr.

12. The method according to claim 7, wherein the source gas comprises at least one of $SiH_4$ and $Si_2H_6$.

13. The method according to claim 7, wherein heat radiating from the substrate stabilizes the reacting chamber ambient while a temperature of the of the substrate stabilizes within a first temperature range.

14. A method for forming a capacitor electrode of a capacitor in a reacting chamber, the method comprising:
    forming a first hemispherical grain (HSG) nuclei by introducing a first source gas into the reacting chamber during a period while the temperature of the reacting chamber ambient is stabilizing at a first temperature range;
    forming a second hemispherical grain (HSG) nuclei over the first HSG nuclei by introducing a second source gas into the reacting chamber after the temperature of the reacting chamber ambient temperature stabilizes at the first temperature range to form a resulting structure; and
    annealing the resulting structure.

15. The method according to claim 14, wherein an amount of the first source gas is less than an amount of the second source gas.

16. The method according to claim 7, further comprising pre-heating the first amount of source gas to about 35° C. prior to introducing the first amount of source gas into the reacting chamber ambient.

17. The method according to claim 16, wherein the reacting chamber ambient is heated to a temperature between 200° C. and 500° C.

* * * * *